United States Patent
Liu

(10) Patent No.: US 12,038,660 B2
(45) Date of Patent: Jul. 16, 2024

(54) ARRAY SUBSTRATE AND MANUFACTURING METHOD THEREOF

(71) Applicant: TCL China Star Optoelectronics Technology Co., Ltd., Guangdong (CN)

(72) Inventor: Qian Liu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/621,290

(22) PCT Filed: Dec. 16, 2021

(86) PCT No.: PCT/CN2021/138862
§ 371 (c)(1),
(2) Date: Dec. 21, 2021

(87) PCT Pub. No.: WO2023/103013
PCT Pub. Date: Jun. 15, 2023

(65) Prior Publication Data
US 2024/0036423 A1 Feb. 1, 2024

(30) Foreign Application Priority Data
Dec. 8, 2021 (CN) .......................... 202111491101.X

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136227* (2013.01); *G02F 1/136286* (2013.01); *H01L 27/124* (2013.01); *H01L 27/1288* (2013.01)

(58) Field of Classification Search
CPC ............. G02F 1/1368; G02F 1/136227; G02F 1/136286; G02F 1/1303; G02F 1/134318;
(Continued)

(56) References Cited

U.S. PATENT DOCUMENTS 8,546,048 B2  10/2013  Riege
2002/0159016 A1 * 10/2002  Nishida ............. G02F 1/134363
                                                349/141
(Continued)

FOREIGN PATENT DOCUMENTS

CN   101738846   6/2010
CN   102033376   4/2011
(Continued)

OTHER PUBLICATIONS

Notice of Reasons for Refusal Dated Jan. 16, 2024 From the Japan Patent Office Re. Application No. 2021-576398 and Its Translation Into English. (6 Pages).

*Primary Examiner* — Victor A Mandala

(57) ABSTRACT

An array substrate and a method of manufacturing the same are provided. The array substrate includes a substrate, a thin film transistor, a first passivation layer, an organic film layer, a common electrode, a second passivation layer and a pixel electrode layer. The organic film layer includes a first via. The common electrode covers the pixel area and includes a second via and a sloped wall surrounding the second via. The second via is connected with the first via, and a gap is located between the bottom edge of the sloped wall and the top edge of the first via. The second passivation layer includes a third via communicating with the second via. The pixel electrode layer is arranged on the second passivation layer and is connected with the second metal layer through the first via, the second via, and the third via.

14 Claims, 5 Drawing Sheets

(58) Field of Classification Search
CPC ............... H01L 27/124; H01L 27/1288; H01L 27/1248; H01L 27/1259
See application file for complete search history.

(56) References Cited

U.S. PATENT DOCUMENTS

| | | |
|---|---|---|
| 2006/0240359 A1 | 10/2006 | Liu |
| 2008/0007679 A1 | 1/2008 | Ochiai |
| 2009/0268134 A1* | 10/2009 | Lee .................. G02F 1/136286 |
| | | 349/110 |
| 2010/0002178 A1 | 1/2010 | Ninomiya |
| 2011/0096259 A1* | 4/2011 | Lee .................... H01L 27/1255 |
| | | 445/24 |
| 2011/0287565 A1 | 11/2011 | Kita |
| 2012/0068944 A1 | 3/2012 | Oh et al. |
| 2012/0145668 A1 | 6/2012 | Riege |
| 2013/0077034 A1 | 3/2013 | Jung et al. |
| 2014/0152938 A1* | 6/2014 | Lee ...................... G09G 3/3648 |
| | | 438/30 |
| 2014/0175442 A1 | 6/2014 | Kwack et al. |
| 2014/0285744 A1* | 9/2014 | Son .................. G02F 1/136204 |
| | | 349/43 |
| 2015/0021630 A1* | 1/2015 | Jang .................. G02F 1/136227 |
| | | 438/29 |
| 2015/0092136 A1* | 4/2015 | Kim .................. G02F 1/134363 |
| | | 438/30 |
| 2016/0357080 A1* | 12/2016 | Son .................. G02F 1/136227 |
| 2017/0146853 A1* | 5/2017 | Lee .................. G02F 1/134309 |
| 2017/0317105 A1* | 11/2017 | Kim ..................... H01L 27/1288 |
| 2017/0351129 A1* | 12/2017 | Morimoto .......... G02F 1/136286 |
| 2018/0122323 A1* | 5/2018 | Park ..................... H01L 29/7869 |
| 2018/0122832 A1* | 5/2018 | Lee .................. G02F 1/133345 |
| 2020/0117300 A1 | 4/2020 | Chen |
| 2021/0036031 A1* | 2/2021 | Nakamura ................ G09F 9/30 |
| 2024/0014225 A1* | 1/2024 | Gong .................. H01L 27/1248 |

FOREIGN PATENT DOCUMENTS

| | | |
|---|---|---|
| CN | 103309100 | 9/2013 |
| CN | 104934449 | 9/2015 |
| CN | 107240590 | 10/2017 |
| CN | 108153021 | 6/2018 |
| JP | 2008-015345 | 1/2008 |
| JP | 2010-014975 | 1/2010 |
| KR | 10-2013-0011794 | 1/2013 |
| KR | 10-2014-0004887 | 1/2014 |
| WO | WO 2015/014071 | 5/2015 |

* cited by examiner

ARRAY SUBSTRATE AND MANUFACTURING METHOD THEREOF

RELATED APPLICATIONS

This application is a National Phase of PCT Patent Application No. PCT/CN2021/138862 having International filing date of Dec. 16, 2021, which claims the benefit of priority of Chinese Patent Application No. 202111491101.X filed on Dec. 8, 2021. The contents of the above applications are all incorporated by reference as if fully set forth herein in their entirety.

FIELD AND BACKGROUND OF THE INVENTION

The present application relates to a technical field of display, and more particularly, to an array substrate and a manufacturing method thereof.

In in-plane switching (IPS) or fringe field switching (FFS) display modes of liquid crystal display panels, a common electrode 91 serves as one end of liquid crystal deflection, and forms, together with the pixel electrode 92, a horizontal electric field (as shown in FIG. 1) to deflect the liquid crystal to realize the image display. The part where pixels are used as the display area to allow the backlight to pass through to produce the three primary colors of red, green, and blue is referred to as the open area. In order to improve viewing angles and display efficiency, the pixel electrodes 91 in the opening area for deflecting the liquid crystal are usually designed in striped shapes. In the liquid crystal display modes, common electrodes and pixel electrodes can be designed in striped shapes. When one type of electrodes (e.g., one of the common electrodes and pixel electrodes) is designed to be striped, the other type of electrodes (e.g., the other of the common electrodes and pixel electrodes) will be designed as a pattern to cover the whole opening area. In the situation where the pixel electrode is designed to be striped and the common electrode is designed as covering the whole opening area, the resistance of the common electrode will be increased, thereby enlarging the capacitive coupling effect on the common electrodes caused by the signal disturbance of gates lines and data lines.

General common electrodes are manufactured using the halftone mask (HTM) process. In the manufacturing process, due to the existence of large area HTM and through holes between pixel electrodes and the second metal layer, it is necessary to meet the following requirements at the same time after the HTM exposure process: the thickness of the residual HTM photolithography film meets the process requirements and the residual HTM photolithography film does not break; and there is no photoresist left in the through hole of the pixel electrode. In general cases, in order to meet the above requirements, it needs to be designed to keep a certain safety distance from the via edge of the common electrode photoresist to the pixel connecting hole, so as to provide enough space to prevent the photoresist from falling into the connecting hole. However, the safety distance required by the manufacturing process so gar is quite large, which leads to the increase of the required space, thus reducing the area of the opening area and the penetration rate, which increases the power consumption of the LCD screen and deteriorates the display effect. In addition, if the safety distance is not enough, it is easy to cause the inner-hole ashing difficulty due to process alignment deviation or critical size fluctuation, and the existence of the residual photoresist make the common electrode unable to be etched, and thus is considered as unwanted substance in the hole, causing abnormal coupling between the pixel electrode and the second metal layer which leads to display anomaly.

SUMMARY OF THE INVENTION

The present application provides an array substrate and a manufacturing method thereof, aiming at solving the technical problem that the conventional common electrode is easy to have residual photoresist in the preparation process of the corresponding pixel through holes, which causes abnormal coupling between the pixel electrode and the second metal layer, thus causing display anomaly.

To solve the above problems, the present application provided technical solutions as follows.

An embodiment of the present application provides an array substrate that comprises a substrate, and comprises a first metal layer, a second metal layer, a first metal trace, a second metal trace and a thin film transistor which are arranged on the substrate. The array substrate further comprises: a first passivation layer covering the thin film transistor; an organic film layer arranged on the first passivation layer and comprising a first via, wherein the first via is located above the thin film transistor; a common electrode arranged on the organic film layer and comprising a second via and a sloped wall surrounding the second via, wherein the second via is connected with the first via, and there is a gap between a bottom edge of the sloped wall and a top edge of the first via; a second passivation layer covering the common electrode and the organic film layer, comprising a third via connected with the second via, and comprising a through hole, wherein the through hole exposes part of the common electrode; and the first via, the second via, and the third via jointly define a first connecting hole which extends to the first passivation layer and penetrates through part of the first passivation layer to expose part of the thin film transistor; and a pixel electrode layer arranged on the second passivation layer, connected to the thin film transistor through the first connecting hole, and connected to the common electrode through the through hole.

Alternatively, the array substrate further comprises a third metal layer arranged on the common electrode and contacting the common electrode, wherein the gap between the bottom edge of the sloped wall of the second via and the top edge of the first via is less than 2.5 microns.

Alternatively, an orthographic projection of the second via on the substrate is larger than and covers an orthographic projection of the first via on the substrate, and the second passivation layer further comprises a cladding wall, wherein the cladding wall is arranged along the first connecting hole and covers a hole wall of the first via and the sloped wall of the second via.

Alternatively, the array substrate further comprises a second connecting hole located on the second metal trace and penetrating through the second passivation layer, the common electrode, the organic film layer, and part of the first passivation layer, wherein the second via exposes the second metal trace; the pixel electrode is connected to the second metal trace through the second connecting hole; and the third metal layer passes through the common electrode and the pixel electrode layer, and is electrically connected to the second metal trace through the second connecting hole.

Alternatively, the first metal layer comprises gate lines, the second metal layer comprises data lines, and a plurality of pixel areas are defined between the gate lines and the data lines, wherein the pixel electrode layer comprises a plurality of pixel electrodes spaced between the pixel areas, and the common electrode is block-shaped and covers the pixel areas.

The present application further provides a manufacturing method of an array substrate. The array substrate comprises a substrate, and comprises a first metal layer, a second metal layer, a first metal trace, a second metal trace and a thin film transistor which are arranged on the substrate. The manufacturing method comprises: depositing a first passivation layer on the substrate to cover the thin film transistor; depositing an organic film layer on the first passivation layer; patterning the organic film layer using a photolithography process and forming a first via, wherein the location of the first via corresponds to the top of the thin film transistor; depositing a common electrode layer on the organic film layer; performing the photolithography process on the common electrode layer using a halftone mask to form a common electrode and a second via corresponding to the first via, wherein the common electrode is formed with a sloped wall adjacent to the second via, the halftone mask comprises at least a hole-forming region and at least one slit arranged around and spaced from the hole-forming region, the hole-forming region corresponds to the second via, and the slit corresponds to the sloped wall, and a gap is formed between the bottom edge of the sloped wall and the top edge of the first via; depositing a second passivation layer that covers the first via, the organic film layer, and the common electrode layer; patterning the second passivation layer using the photolithography process, and forming a third via and a through hole, wherein the through hole exposes part of the common electrode, wherein the first via, the second via, and the third via jointly define a first connecting hole which extends to the first passivation layer and penetrates part of the first passivation layer and exposes part of the thin film transistor; depositing a pixel electrode layer on the second passivation layer; and patterning the pixel electrode layer using the photolithography process to form a pixel electrode layer, wherein the pixel electrode layer is connected with the thin film transistor through the first connecting hole, and is connected with the common electrode through the through hole.

Alternatively, the step of depositing a common electrode layer on the organic film layer further comprises: depositing a third metal layer on the common electrode layer; and performing multiple photolithography processes on the common electrode layer and the third metal layer using the halftone mask, to pattern the common electrode layer and the third metal layer.

Alternatively, the halftone mask further comprises a film-forming region, and the slit is located between the film-forming region and the hole-forming region, wherein the film-forming region is configured to form the common electrode, the hole-forming region is configured to form the second via, and the slit is configured to form a sloped wall around the second via, wherein the gap between the bottom edge of the sloped wall and the top edge of the first via is less than 2.5 microns.

Alternatively, before the step of depositing the first passivation layer, the manufacturing method further comprises a step of forming the thin film transistor, and the step of forming the thin film transistor comprises: forming the first metal layer on the substrate, wherein the first metal layer comprises a gate and a first metal trace; depositing a gate insulating layer on the substrate and the first metal layer; forming an active layer above the gate on the gate insulating layer; forming a contact hole on the gate insulating layer using the photolithography process, to expose the first metal trace; depositing a second metal layer on the active layer and the gate insulating layer; and forming a source, a drain and a second metal trace on the second metal layer using the photolithography process, wherein the second metal trace is connected with the first metal trace through the contact hole.

Alternatively, the manufacturing method of the array substrate further comprises: forming a second connecting hole in the second passivation layer so that the second connecting hole is above the second metal trace, wherein the second connecting hole penetrates the second passivation layer, the common electrode layer, the organic film layer and part of the first passivation layer to expose the second metal trace; and the pixel electrode layer is connected with the second metal trace and the first metal trace through the second connecting hole.

An embodiment of the present application further provides an array substrate that comprises a substrate and comprises a first metal layer, a second metal layer, a first metal trace, a second metal trace, a thin film transistor, and a third metal layer which are arranged on the substrate. The first metal layer comprises a gate line, the second metal layer comprises a data line, a plurality of pixel areas are defined between the gate line and the data line, and the array substrate further comprises: a first passivation layer covering the thin film transistor; an organic film layer arranged on the first passivation layer and comprising a first via, wherein the first via is located above the thin film transistor; a common electrode arranged on the organic film layer and comprising a second via and a sloped wall surrounding the second via, wherein the second via is connected with the first via, and there is a gap between a bottom edge of the sloped wall and a top edge of the first via; a second passivation layer covering the common electrode and the organic film layer, comprising a third via that connected with the second via, and comprising a through hole, wherein the through hole exposes part of the common electrode; and the first via, the second via, and the third via jointly define a first connecting hole which extends to the first passivation layer and penetrates part of the first passivation layer to expose part of the thin film transistor; and a pixel electrode layer arranged on the second passivation layer, connected to the thin film transistor through the first connecting hole, and connected to the common electrode through the through hole. The pixel electrode layer comprises a plurality of pixel electrodes spaced between the pixel areas; the common electrode is block-shaped and covers the pixel areas; and the third metal layer covering the pixel area is arranged on the common electrode and contacts the common electrode.

The present application has advantageous effects as follows: the present application provides an array substrate and a manufacturing method thereof. The third metal layer and the common electrode layer are photoetched using a halftone mask with the slit, so that optical correction is applied to the excavated area of the common electrode layer, the photoresist morphology at the edge of the via of the common electrode is optimized, and the photoresist thickness at the edge of the via is reduced, so that enough space can be provided to reduce the risk of photoresist piling up and falling into the organic film layer hole at the edge of the via, thereby effectively solving the technical problems that the required space is increased due to the relative large safety distance required by the conventional process, the area of the opening area is reduced, the penetration rate is reduced, the power consumption of the liquid crystal display screen is increased, and the display effect is deteriorated. In addition, through the design of the third metal layer, the resistance of the common electrode can be reduced, and the coupling effect on the capacitance formed by the common electrode caused by the signal disturbance of the gate lines and the data lines can be effectively reduced.

BRIEF DESCRIPTION OF THE SEVERAL VIEWS OF THE DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF SPECIFIC EMBODIMENTS OF THE INVENTION

Figure 1:
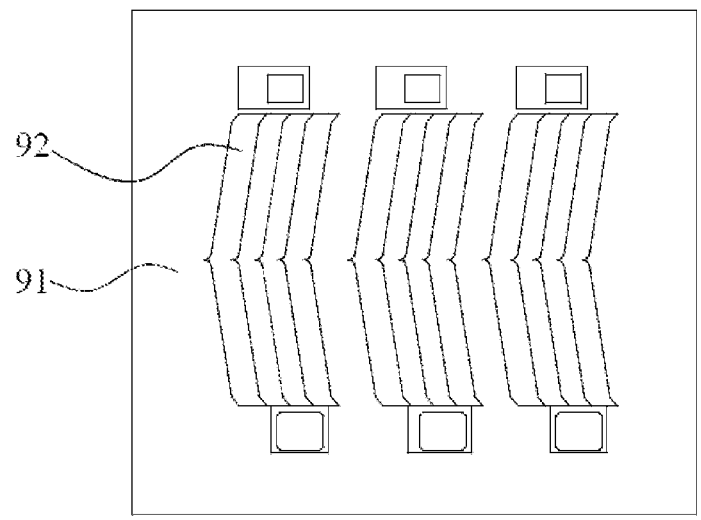
FIG. 1 is a diagram illustrating the structure of conventional pixel electrodes and common electrodes.

The following embodiments are described with reference to the attached drawings to exemplify particular embodiments in which the present application may be implemented. Some terms used in the present application, e.g., "left", "right", "inside," "outside," "side," etc., should be referenced with the directions shown in the drawings. Accordingly, these directional terms are intended to help illustrate and understand the present application, and are not intended to limit the scope of the present application.

The present application provides an array substrate for a liquid crystal display panel and a manufacturing method thereof. Particularly, the array substrate of the present application is based on a liquid crystal display panel in which a horizontal electric field is jointly formed by common electrodes and pixel electrodes as one end of liquid crystal deflection.

Figure 2:
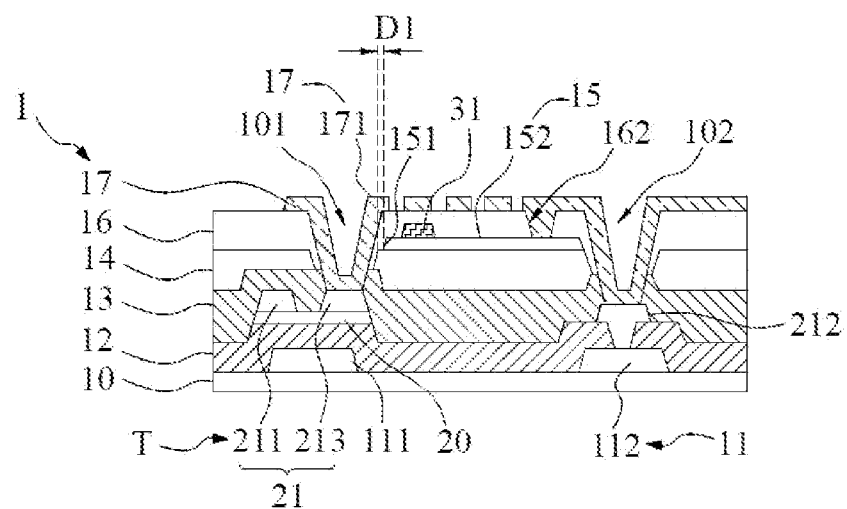
FIG. 2 is a diagram illustrating a cross-sectional view of the structure of an array substrate according to an embodiment of the present application.

Please refer to FIG. 2, which is a diagram illustrating a cross-sectional view of the structure of an array substrate according to an embodiment of the present application. As shown in FIG. 2, the array substrate 1 of the present application includes a substrate 10, and includes a first metal layer 11, a gate insulating layer 12, an active layer 20, a second metal layer 21, a third metal layer 31, a first passivation layer 13, an organic film layer 14, a block-shaped common electrode 152, a second passivation layer 16, and a pixel electrode layer 17 which are sequentially stacked on the substrate 10 and from bottom to top. Specifically, in this embodiment, the first metal layer 11 includes a gate 111 and a first metal trace 112; the second metal layer 21 includes a source 211, a second metal trace 212, and a drain 213. Similar to general thin film transistor structures, in the present application, the gate 111, the gate insulating layer 12, the active layer 20, the source 211, and the drain 213 of the present application together constitute a thin film transistor T. The second metal trace 212 includes data lines, the first metal trace 112 includes gate lines, and a pixel area (i.e., the display area) is defined between the data lines and the gate lines.

As shown in FIG. 2, the organic film layer 14 is arranged on the first passivation layer 13 and includes a first via 140, and the first via 140 is located above the thin film transistor T. The common electrode 152 is arranged on the organic film layer 14 and covers the pixel area, and includes a second via 150 and a sloped wall 151 surrounding the second via 150. The second via 150 connects with the first via 140, and there is a distance D1 between the bottom edge of the sloped wall 151 and the top edge of the first via 140. The second passivation layer 16 covers the common electrode 15 and the organic film layer 14, and includes a third via 160 connecting to the second via 150 and includes a through hole 162, wherein the through hole 162 exposes part of the common electrode 15. Specifically, the first via 140, the second via 150, and the third via 160 jointly define the first connecting hole 101. The first connecting hole 101 extends to the first passivation layer 13 and penetrates part of the first passivation layer 13 to expose part of the thin film transistor T.

In this embodiment, the pixel electrode layer 17 includes a plurality of pixel electrodes 171 spaced apart from each other, and contacts the drain 213 of the second metal layer 21 through the first connecting hole 101, and is connected to the common electrode 15 through the through hole 162. As shown in FIG. 2, in the pixel electrode layer 17, the common electrode 152 are block-shaped, and both the pixel electrode 171 and the common electrode 152 are transparent. In the present application, the pixel electrode 171 and the common electrode 152 are located on the same side to jointly form a horizontal electric field to deflect liquid crystals, thereby realizing the function of display.

Referring to FIG. 2, the third metal layer 31 is arranged on the common electrode layer 15 and is electrically connected to the data line of the second metal trace 212 and the gate line of the first metal trace 112 through the pixel electrode 171 and the second connecting hole 102. Because the third metal layer 31 directly overlaps with the common electrode 152, the resistance generated by the structure composed of the third metal layer 31 and the common electrode 152 is much smaller than that generated by the common electrode layer 152 alone, so that the capacitive coupling effect formed by the common electrode caused by the signal disturbance of gate lines and data lines can be effectively reduced. The manufacturing method and detailed structure of the array substrate 1 according to the embodiment of the present application will be described later.

The embodiment of the present application further provides a manufacturing method of the array substrate, i.e., a method for manufacturing the array substrate 1 of the above embodiment.

Figure 3:
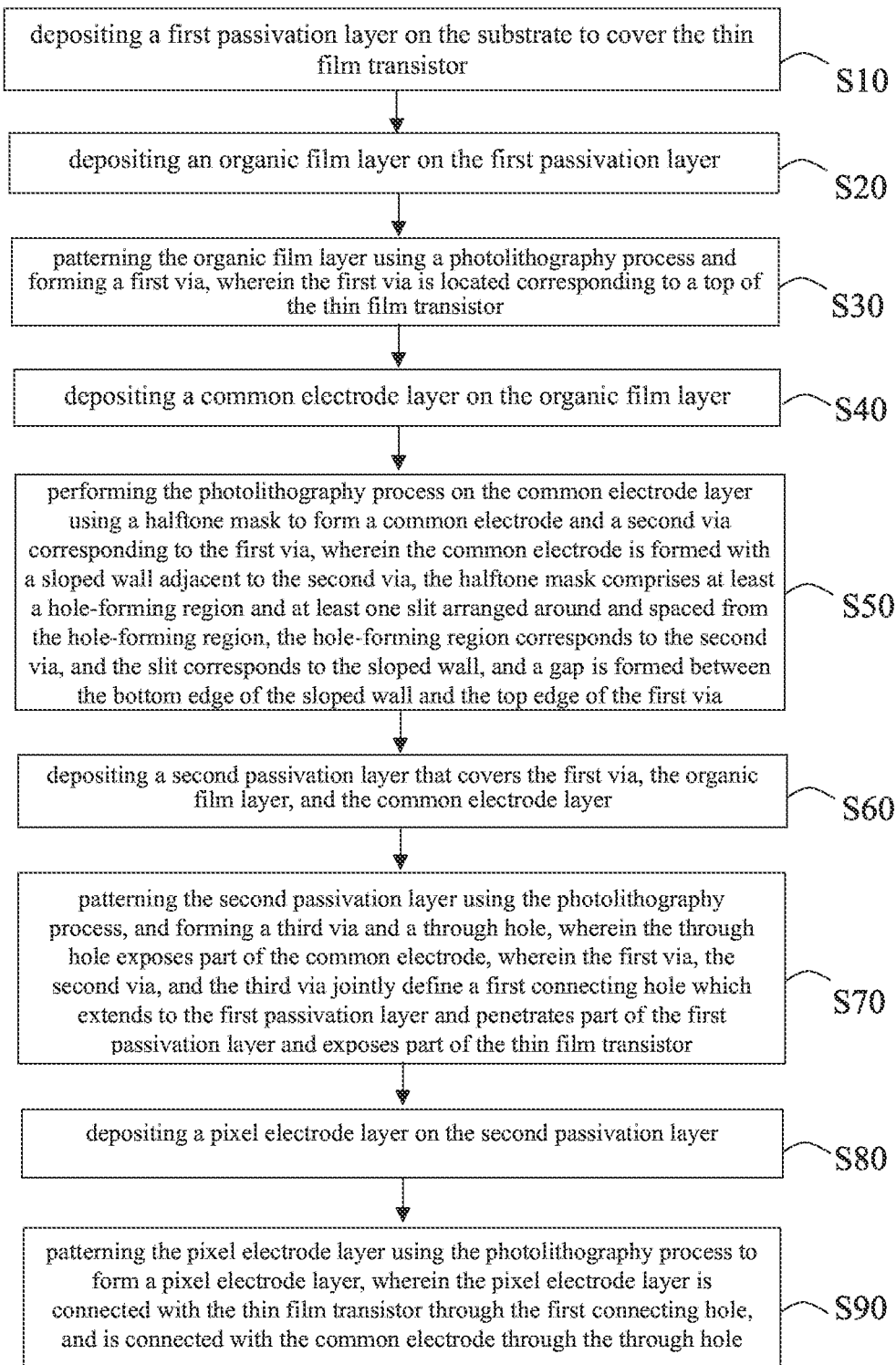
FIG. 3 is a flowchart illustrating a manufacturing method of the array substrate according to an embodiment of the present application.

Please refer to FIGS. 3, and 4-10. FIG. 3 is a flowchart illustrating a manufacturing method of the array substrate 1 according to an embodiment of the present application. FIG. 4 to FIG. 10 are diagrams illustrating the structures of film layers after executing each step of the manufacturing method of the array substrate according to an embodiment of the present application. As shown in FIG. 3, the manufacturing method of the array substrate 1 of the present application includes steps S10 to S90. Specifically, the step of forming the thin film transistor T further includes, before Step S10, a step of forming the thin film transistor T.

The film structure corresponding to the step of forming the thin film transistor T is shown in FIGS. 4 to 7.

Figure 4:
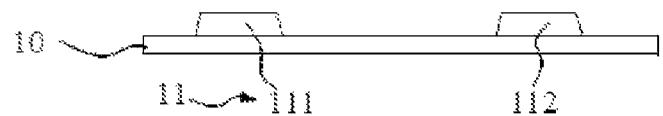
FIGS. 4, 5, 6, 7, 8, 9, and FIG. 10 are diagrams illustrating the structures of film layers after executing each step of the manufacturing method of the array substrate according to an embodiment of the present application.

As shown in FIG. 4, a first metal layer 11 is formed on the substrate 10, and the first metal layer 11 includes a gate 111 and a first metal trace 112. Specifically, the first metal layer 11 is deposited on the substrate 10 using the physical vapor deposition (PVD) process, and the first metal layer 11 is patterned by the photolithography process and wet etching process to form the gate 111 and the first metal traces 112 that includes gate lines. It should be noted that the photolithography process includes the processes of coating photoresist, prebaking, exposure with a mask, development, post baking, etching, stripping photoresist, and so on. Since the wet etching process is the same as the general wet etching process, the detailed descriptions thereof is omitted here for brevity. In addition, the material of the substrate 10 can be glass or transparent plastic, but preferably glass.

Figure 5:
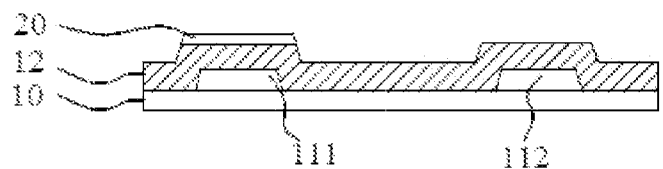

Referring to FIG. 5, a gate insulating layer 12 is deposited on the substrate 10 and the first metal layer 11. Specifically, the gate insulating layer 12 is deposited by the chemical vapor deposition (CVD) process, wherein the gate insulating layer 12 is made of silicon nitride or silicon oxide.

Further referring to FIG. 5, an active layer 20 above the gate 111 is formed on the gate insulating layer 12. Specifically, an indium gallium zinc oxide (IGZO) is deposited via the PVD process as the active layer 20. In this embodiment, the active layer 20 can be a metal oxide semiconductor of IGZO, indium zinc tin oxide (IZTO) or indium gallium zinc tin oxide (IGZTO), but preferably IGZO. In addition, the active layer 20 is formed by a photolithography process and a wet etching process.

Figure 6:
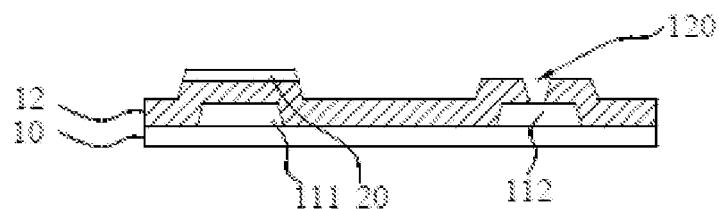

Referring to FIG. 6, a contact hole 120 is formed on the gate insulating layer 12 using the photolithography process to expose the first metal trace 112 (i.e., the gate line). Specifically, the gate insulating layer 12 is patterned by dry etching, so that the contact hole 120 is formed.

Figure 7:
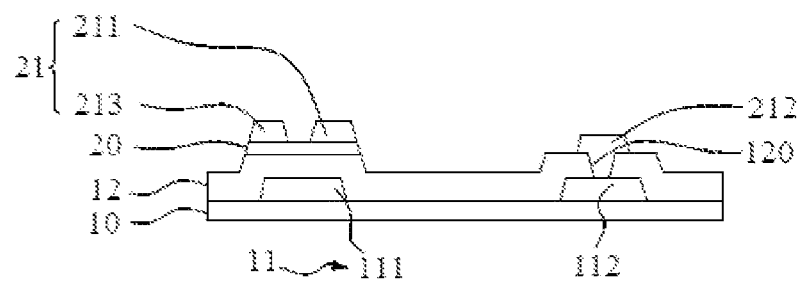

Referring to FIG. 7, a second metal layer 21 is deposited on the active layer 20 which is further on the gate insulating layer 12. Specifically, the second metal layer 21 is deposited using the PVD process. In addition, the source 211, the drain 213, and the second metal trace 212 are formed on the second metal layer 21 by a wet etching process, wherein the second metal trace 212 includes a data line and is connected to the first metal trace 112 (i.e., a gate line) through the contact hole 120. Accordingly, the production of the thin film transistor T of the present application is completed. Specifically, a pixel area (i.e., display area) is defined between data lines and gate lines.

Figure 8:
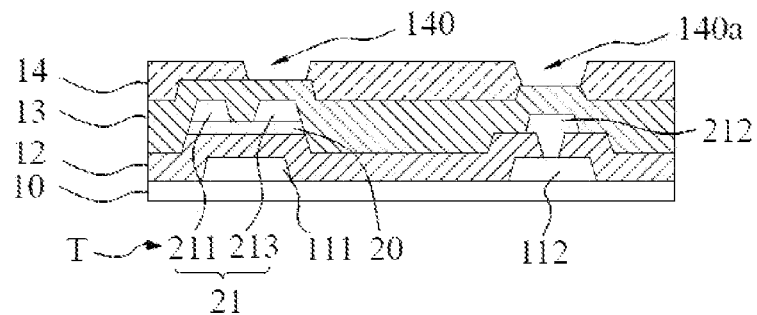

Please refer to FIG. 8, which shows the film structure manufactured according to Step S10 of the manufacturing method of the present application as follows. Step S10: deposit first passivation layer on the substrate to cover the thin film transistor. Specifically, nitride materials (e.g., the silicon nitride, etc.) and oxide materials (e.g., silicon oxide, silicon dioxide, etc.) are deposited under the aforementioned film structure with thin film transistor T using the CVD process, as the first passivation layer 13.

Step S20: deposit an organic film layer on the first passivation layer. Specifically, the material of the organic film layer 14 can be polyfluoroalkoxy (PFA), which can further change the flatness of the lower film surface, to realize planarization and prevent electric fields from interfering with each other.

Step S30: pattern the organic film layer by photolithography process and form a first via, wherein the location of the first via corresponds to the top of the thin film transistor. As shown in FIG. 8, the organic film layer 14 is patterned to form a first via 140 and a first opposing via 140a, wherein the first via 140 is directly above the thin film transistor T, and the first opposing via 140a is formed above the second metal trace 212 (i.e., the data line), e.g., right above the first metal trace 112 (i.e., the gate line).

Step S40: Deposit a common electrode layer on the organic film layer. Specifically, as shown in FIG. 8, the common electrode layer 15 is first deposited by the PVD process, and can be made of Indium Tin Oxide (ITO). Then, a third metal layer 31 is deposited by the PVD process, and can be made of copper, wherein the common electrode layer 15 covers the pixel area.

Step S50: perform the photolithography process on the common electrode layer using a halftone mask to form a common electrode and a second via corresponding to the first via, and form a sloped wall on the common electrode adjacent to the second via, wherein the halftone mask includes at least a hole-forming region and at least one slit. The slit is arranged around and spaced from the hole-forming region. The hole-forming region corresponds to the second via, and the slit corresponds to the sloped wall, wherein there is a gap between the bottom edge of the sloped wall and the top edge of the first via.

Figure 9:
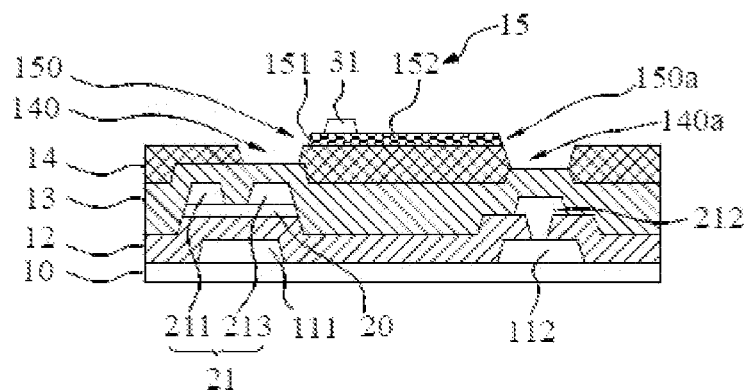
Figure 11A:
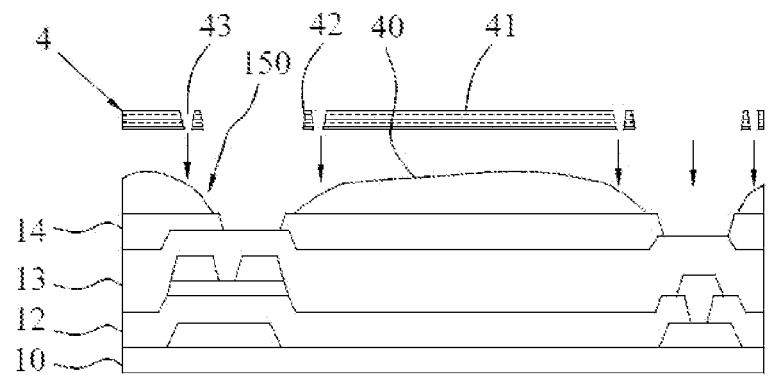
FIG. 11A is a diagram illustrating the cross-sectional view of the structure of producing common electrodes according to an embodiment of the present application.
Figure 11B:
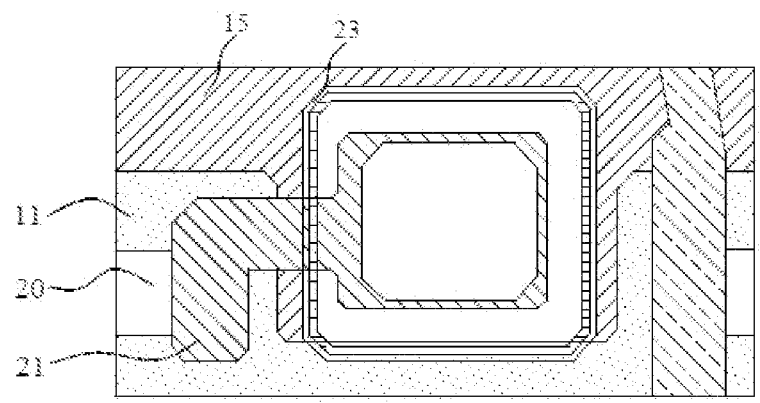
FIG. 11B is a diagram illustrating the plane view of the structure of producing common electrodes according to an embodiment of the present application.

Please refer to FIG. 9 in conjunction with FIGS. 11A and 11B. FIG. 11A is a diagram illustrating the cross-sectional view of the structure of producing common electrodes according to an embodiment of the present application, and FIG. 11B is a diagram illustrating the plane view of the structure of producing common electrodes according to an embodiment of the present application. As shown in FIG. 11A, the present application uses the halftone mask 4 to perform multiple photolithography processes on the common electrode layer 15 and the third metal layer 31 in order to pattern the common electrode layer 15 and the third metal layer 31, thereby forming the common electrode 152 and the patterned third metal layer 31.

As shown in FIG. 11A, the halftone mask 4 is configured to expose the photoresist layer 40 covering the organic film layer 14 in order to perform development. In this embodiment, the halftone mask 4 includes a film-forming region 41, a hole-forming region 42, and at least one slit 43, and the slit 43 surrounds and is spaced from the hole-forming region 42. Specifically, the film forming region 41 of the halftone mask 4 is configured to form the common electrode 152, the hole forming region 42 is configured to form the second via 150, and the slit 43 is configured to form the sloped wall 151 surrounding the second via 150. As shown in FIG. 11B, the upper periphery of the second via 150 of the common electrode layer 15 corresponds to the slit 43. The slit 43 of the present application is used as the halftone mask for the weak light shielding area at the edge, to reduce the thickness of photoresist near the edge of the hole.

Furthermore, due to the slit 43 on the halftone mask 4, part of the light will pass through the slit 43 and be reflected at the interface of the lower film layer, so that the present application can prevent the problem encountered in related art where the slope of the via is too deep because it is formed by a mask without the design of slits. The photoresist layer 40 coated on the common electrode layer 15 and the third metal layer 31 of the present application forms a section of via slope with a smaller slope around the corresponding first via 140.

Specifically, the photolithography process in Step S50 includes: coating the photoresist layer 40 on the common electrode layer 15 and the third metal layer 31, and performing exposure development. Meanwhile, the third metal layer 31 corresponds to an opaque region (i.e., the film-forming region) of the halftone mask, the common electrode 152 corresponds to a translucent region (i.e., the film-forming region) of the halftone mask, and an excavated region of the common electrode layer 15 and the periphery of the display area (i.e., the pixel area) correspond to the transparent area (i.e., the hole-forming region) of the halftone mask. Next, the first etching is performed to etch the third metal layer 31 corresponding to the periphery of the display area and the excavated area of the common electrode layer 15. Then, an ashing process is performed to remove the residual photoresist after etching. Then, the second etching is performed to etch parts of the common electrode layer 15 where there is no pattern position of the third metal layer 31, thereby forming the second via 150 of the common electrode layer 15. Finally, the third etching is performed to etch the third metal layer 31 corresponding to the translucent region, leaving the common electrode pattern under the semi-transparent region as well as the third metal layer 31 and the common electrode pattern 152 under the third metal layer 31 protected by photoresist. After that, the photoresist on the third metal layer 31 is removed, thereby completing the photolithography process of Step S50. In addition, in the process of preparing the second via 150, a second opposing via 150a corresponding to the first opposing via 140a is also formed, which connects to the first opposing via 140a (as shown in FIG. 9).

Through the above steps, the gap between the bottom edge of the sloped wall 151 of the common electrode layer 15 and the top edge of the first via 140 is less than 2.5 microns, and the orthographic projection of the second via 150 on the substrate 10 is larger than and covers the orthographic projection of the first via 140 on the substrate 10 (as shown in FIG. 2). In other words, in the present application, the third metal layer 31 and the common electrode layer 15 are performed with photolithography process using a halftone mask with slits. That is, the photo mask optical correction is added to the excavated area of the common electrode layer 15, so as to optimize outlook of the photoresist at the edge of the third via of the common electrode, thereby reducing the photoresist thickness at the edge of the hole, and reducing the risk of photoresist at the edge of the via falling into the hole of the organic film layer.

Figure 10:
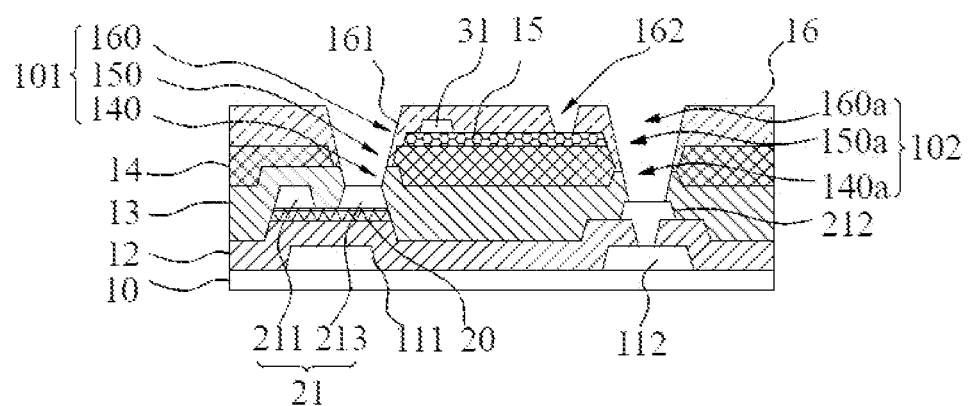

Step S60: deposit a second passivation layer to cover the first via, the organic film layer, and the common electrode layer. Specifically, as shown in FIG. 10, the second passivation layer 16, which can be silicon nitride, is deposited on the substrate 10 by the CVD process.

Step S70: pattern the second passivation layer using the photolithography process, and forming a third via and a through hole. Specifically, as shown in FIG. 10, the through hole 162 exposes a part of the common electrode 15. The first via 140, the second via 150, and the third via 160 jointly define a first connecting hole 101, and the first connecting hole 101 extends to the first passivation layer 13 and penetrates part of the first passivation layer 13 to expose the drain 213 of the thin film transistor T. In addition, in the process of forming the third via 160, a third opposing via 160a corresponding to the second opposing via 150a is formed at the same time in the second passivation layer 16. As shown in FIG. 10, the first opposing via 140a, the second opposing via 150a and the third opposing via 160a together form the second connecting hole 102.

In addition, the prepared second passivation layer 16 also includes a cladding wall 161. The covering wall 161 is arranged along the first connecting hole 101, and is inclined from top to bottom toward the bottom of the first via 140 to cover the hole wall of the first via 140 and the sloped wall 151 of the second via 150.

Step S80: deposit a pixel electrode layer on the second passivation layer.

Step S90: pattern the pixel electrode layer using the photolithography process to form a pixel electrode, and the pixel electrode is connected to the source of the thin film transistor through the first connecting hole. Specifically, as shown in FIG. 2, the pixel electrode layer 17 is deposited and patterned on the substrate using the PVD process to form the pixel electrode 171. As shown in FIG. 2, the pixel electrode 171 is connected to the drain 213 of the thin film transistor T through the first connecting hole 101, and is connected to the common electrode 152 through the through hole 162.

Referring to FIG. 2, the second connecting hole 102 penetrates the second passivation layer 16, the common electrode layer 15, the organic film layer 14, and part of the first passivation layer 13 to expose the second metal trace 212, wherein the pixel electrode 171 is connected to the second metal trace 212 (i.e., data line) of the second metal layer 21 and the first metal trace 112 (i.e., gate line) of the first metal layer 11 through the second connecting hole 102.

In view of the above, the present application provides an array substrate and manufacturing method thereof, that utilize a halftone mask with the slit to perform the photo-etching process on the third metal layer and the common electrode layer to apply optical correction to the excavated area of the common electrode layer, thereby optimizing the outline of the photoresist at the edge of the via of the common electrode, and reducing the thickness of the photoresist at the edge of the via. Even with relatively small common electrode, the array substrate and the manufacturing method thereof of the present application can provide enough space to reduce the possibility that the photoresist at the edge of the via is piled up and falls into holes of the organic film layer, and thus effectively prevent the problem that conventional process requires large safety distance which results in the need of a larger space for configuration, reduces the opening area, and the penetration rate, and increases the power consumption as well as deteriorating the display performance of the liquid crystal display screen. In addition, with the design of the third metal layer, the resistance of the common electrode can be reduced, and the capacitive coupling effect on the common electrode caused by the signal disturbance of the gate lines and the data lines can be effectively reduced.

In the above embodiments, the description of each embodiment has its own emphasis. For the parts that are not detailed in one embodiment, please refer to the related descriptions of other embodiments.

The above embodiment of the present application provides a detailed description, and specific examples are applied in this paper to illustrate the principles and implementation of the present application. The above embodiment description is only used to help understand the method of the present application and its core ideas. Further, one skilled in the art can change or modify the above embodiments based on the main ideas of the present invention. Therefore, the exemplary contents in the specification should not be realized as a limitation of the scope of the present application.

What is claimed is:

1. An array substrate, comprising a substrate, and a first metal layer, a second metal layer, a first metal trace, a second metal trace, and a thin film transistor which are arranged on the substrate, the array substrate further comprising:

a first passivation layer covering the thin film transistor;
an organic film layer arranged on the first passivation layer and comprising a first via, wherein the first via is located above the thin film transistor;
a common electrode arranged on the organic film layer and comprising a second via and a sloped wall surrounding the second via, wherein the second via is connected with the first via, and a gap is located between a bottom edge of the sloped wall and a top edge of the first via;
a second passivation layer covering the common electrode and the organic film layer, and comprising a third via communicating with the second via, and a through hole, wherein the through hole exposes part of the common electrode, and the first via, the second via, and the third via jointly define a first connecting hole which extends to the first passivation layer and penetrates part of the first passivation layer to expose part of the thin film transistor; and
a pixel electrode layer arranged on the second passivation layer and connected to the thin film transistor through the first connecting hole, and connected to the common electrode through the through hole.

2. The array substrate of claim 1, further comprising a third metal layer arranged on the common electrode and contacting the common electrode, wherein the gap between the bottom edge of the sloped wall of the second via and the top edge of the first via is less than 2.5 microns.

3. The array substrate of claim 1, wherein an orthographic projection of the second via on the substrate is larger than and covers an orthographic projection of the first via on the substrate, and the second passivation layer further comprises a cladding wall, wherein the cladding wall is arranged along the first connecting hole and covers a hole wall of the first via and the sloped wall of the second via.

4. The array substrate of claim 2, wherein the array substrate further comprises a second connecting hole located on the second metal trace and penetrating the second passivation layer, the common electrode, the organic film layer, and part of the first passivation layer, wherein the second via exposes the second metal trace, the pixel electrode layer is connected to the second metal trace through the second connecting hole, and the third metal layer is electrically connected to the second metal trace through the second connecting hole and the common electrode and the pixel electrode layer.

5. The array substrate of claim 1, wherein the first metal layer comprises gate lines, the second metal layer comprises data lines, and a plurality of pixel areas are defined between the gate lines and the data lines, wherein the pixel electrode layer comprises a plurality of pixel electrodes spaced apart from each other in the pixel areas, and the common electrode is block-shaped and covers the pixel areas.

6. A manufacturing method of an array substrate, the array substrate comprising a substrate, and a first metal layer, a second metal layer, a first metal trace, a second metal trace, and a thin film transistor which are arranged on the substrate, the manufacturing method comprising:
depositing a first passivation layer on the substrate to cover the thin film transistor;
depositing an organic film layer on the first passivation layer;
patterning the organic film layer using a photolithography process and forming a first via, wherein the first via is located corresponding to a top of the thin film transistor;
depositing a common electrode layer on the organic film layer;
performing the photolithography process on the common electrode layer using a halftone mask to form a common electrode and a second via corresponding to the first via, wherein the common electrode is formed with a sloped wall adjacent to the second via, the halftone mask comprises at least a hole-forming region and at least one slit arranged around and spaced from the hole-forming region, the hole-forming region corresponds to the second via, and the slit corresponds to the sloped wall, and a gap is formed between the bottom edge of the sloped wall and the top edge of the first via;
depositing a second passivation layer that covers the first via, the organic film layer, and the common electrode layer;
patterning the second passivation layer using the photolithography process, and forming a third via and a through hole, wherein the through hole exposes part of the common electrode, wherein the first via, the second via, and the third via jointly define a first connecting hole which extends to the first passivation layer and penetrates part of the first passivation layer and exposes part of the thin film transistor;
depositing a pixel electrode layer on the second passivation layer; and
patterning the pixel electrode layer using the photolithography process to form a pixel electrode layer, wherein the pixel electrode layer is connected with the thin film transistor through the first connecting hole, and is connected with the common electrode through the through hole.

7. The manufacturing method of the array substrate of claim 6, wherein the step of depositing the common electrode layer on the organic film layer further comprises:
depositing a third metal layer on the common electrode layer; and
performing multiple photolithography processes on the common electrode layer and the third metal layer using the halftone mask to pattern the common electrode layer and the third metal layer.

8. The manufacturing method of the array substrate of claim 6, wherein the halftone mask further comprises a film-forming region, and the slit is located between the film-forming region and the hole-forming region, wherein the film-forming region is configured to form the common electrode, the hole-forming region is configured to form the second via, and the slit is configured to form a sloped wall around the second via, wherein the gap between the bottom edge of the sloped wall and the top edge of the first via is less than 2.5 microns.

9. The manufacturing method of the array substrate of claim 6, wherein before the step of depositing the first passivation layer, the manufacturing method further comprises a step of forming the thin film transistor, and the step of forming the thin film transistor comprises:
forming the first metal layer on the substrate, wherein the first metal layer comprises a gate and a first metal trace;
depositing a gate insulating layer on the substrate and the first metal layer;
forming an active layer above the gate on the gate insulating layer;
forming a contact hole on the gate insulating layer using the photolithography process to expose the first metal trace;
depositing a second metal layer on the active layer and the gate insulating layer; and forming a source, a drain, and a second metal trace on the second metal layer using the photolithography process, wherein the second metal trace is connected with the first metal trace through the contact hole.

10. The manufacturing method of the array substrate of claim 9, further comprising:

forming a second connecting hole in the second passivation layer so that the second connecting hole is located above the second metal trace, wherein the second connecting hole penetrates the second passivation layer, the common electrode layer, the organic film layer, and part of the first passivation layer to expose the second metal trace, and the pixel electrode layer is connected with the second metal trace and the first metal trace through the second connecting hole.

11. An array substrate, comprising a substrate, and a first metal layer, a second metal layer, a first metal trace, a second metal trace, a thin film transistor, and a third metal layer which are arranged on the substrate, wherein the first metal layer comprises a gate line, the second metal layer comprises a data line, a plurality of pixel areas are defined between the gate line and the data line, and the array substrate further comprises:

a first passivation layer covering the thin film transistor;

an organic film layer arranged on the first passivation layer and comprising a first via, wherein the first via is located above the thin film transistor;

a common electrode arranged on the organic film layer and comprising a second via and a sloped wall surrounding the second via, wherein the second via is connected with the first via, and a gap is located between a bottom edge of the sloped wall and a top edge of the first via;

a second passivation layer covering the common electrode and the organic film layer, and comprising a third via communicating with the second via, and a through hole, wherein the through hole exposes part of the common electrode, and the first via, the second via, and the third via jointly define a first connecting hole which extends to the first passivation layer and penetrates part of the first passivation layer to expose part of the thin film transistor; and a pixel electrode layer arranged on the second passivation layer and connected to the thin film transistor through the first connecting hole, and connected to the common electrode through the through hole;

wherein the pixel electrode layer comprises a plurality of pixel electrodes spaced apart from each other in the pixel areas, the common electrode is block-shaped and covers the pixel areas, and the third metal layer area is arranged on the common electrode and contacts the common electrode.

12. The array substrate of claim 11, wherein the gap between the bottom edge of the sloped wall of the second via and the top edge of the first via is less than 2.5 microns.

13. The array substrate of claim 11, wherein an orthographic projection of the second via on the substrate is larger than and covers an orthographic projection of the first via on the substrate, and the second passivation layer further comprises a cladding wall, wherein the cladding wall is arranged along the first connecting hole and covers a hole wall of the first via and the sloped wall of the second via.

14. The array substrate of claim 11, wherein the array substrate further comprises a second connecting hole located on the second metal trace and penetrating the second passivation layer, the common electrode, the organic film layer, and part of the first passivation layer, wherein the second connecting hole exposes the second metal trace, the pixel electrode layer is connected to the second metal trace through the second via, and the third metal layer is electrically connected to the second metal trace through the second connecting hole and the common electrode and the pixel electrode layer.

* * * * *